(12) United States Patent
Wang et al.

(10) Patent No.: US 8,298,386 B2
(45) Date of Patent: Oct. 30, 2012

(54) GAS-INPUTTING DEVICE FOR VACUUM SPUTTERING APPARATUS

(75) Inventors: Chung-Pei Wang, Taipei Hsien (TW); Chia-Ying Wu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 238 days.

(21) Appl. No.: 12/730,257

(22) Filed: Mar. 24, 2010

(65) Prior Publication Data

US 2011/0048933 A1    Mar. 3, 2011

(30) Foreign Application Priority Data

Aug. 28, 2009  (CN) .......................... 2009 1 0306236

(51) Int. Cl.
*C23C 14/35*    (2006.01)
(52) U.S. Cl. ............... 204/298.07; 118/715; 156/345.33

(58) Field of Classification Search ............. 204/298.07; 118/715; 156/345.29, 345.33, 345.34
See application file for complete search history.

(56) References Cited

U.S. PATENT DOCUMENTS

| | | | |
|---|---|---|---|
| 4,849,087 A * | 7/1989 | Meyer ..................... 204/298.03 |
| 5,662,784 A * | 9/1997 | Schuhmacher et al. . 204/298.07 |
| 5,704,981 A | 1/1998 | Kawakami et al. |
| 6,881,295 B2 * | 4/2005 | Nagakura ................ 156/345.33 |
| 2005/0211544 A1 * | 9/2005 | Reiter ........................ 204/192.2 |

* cited by examiner

*Primary Examiner* — Rodney McDonald
(74) *Attorney, Agent, or Firm* — Altis Law Group, Inc.

(57) ABSTRACT

A gas-inputting device for a vacuum sputtering apparatus includes at least one tapered tube. Each tapered tube includes a open end, a closed end, and a conical surface. The small end is configured for introducing gas into the tapered tube. The large end opposes to the open end. Each of the at least one tapered tube tapers from the closed end to the open end. The conical surface connects the open end to the closed end. A plurality of gas holes of a same size are defined in the conical surface and equidistantly arranged along the center axis of the tapered tube from the open end to the closed end.

12 Claims, 2 Drawing Sheets

GAS-INPUTTING DEVICE FOR VACUUM SPUTTERING APPARATUS

BACKGROUND

1. Technical Field

The present disclosure relates to coating technology, and particularly to a gas-inputting device for a vacuum sputtering apparatus.

2. Description of Related Art

Generally, during sputter-coating of a number of workpieces such as cell phone housings. An inert gas is injected into a sputter-coating chamber via a gas-inputting device to release energized ions. The energized ions bombard a solid target material to vaporize the material. The vaporized material is then deposited on the workpieces. The gas-inputting device includes a number of tubes with different length. The tubes are parallel to each other. Each tube has a first end connected to a gas source, and an opposite second end disposed at different height of the sputter-coating chamber for inputting the inert gas into the sputter-coating chamber. However, the amount of the inert gas inputted from different length tubes is different because the pressure of the inert gas injected into the sputter-coating chamber from the first end to the second end will decrease as the length of the tubes increases. The shorter tube has a higher gas pressure, and outputs more inert gas. The longer tube has a lower gas pressure, and outputs less inert gas. Therefore, the gas density of the inert gas at a higher position will be higher than that at a lower position. The non-uniform gas density of the inert gas will affect the coating quality of the workpiece.

What is needed, therefore, is a gas-inputting device for a vacuum sputtering apparatus to overcome the above-described problem.

BRIEF DESCRIPTION OF THE DRAWINGS

Many aspects of the present gas-inputting device for a vacuum sputtering apparatus can be better understood with reference to the following drawings. The components in the drawings are not necessarily drawn to scale, the emphasis instead being placed upon clearly illustrating the principles of the gas-inputting device for a vacuum sputtering apparatus.

DETAILED DESCRIPTION

Embodiments of the present disclosure will now be described in detail below, with reference to the accompanying drawings.

Figure 1:
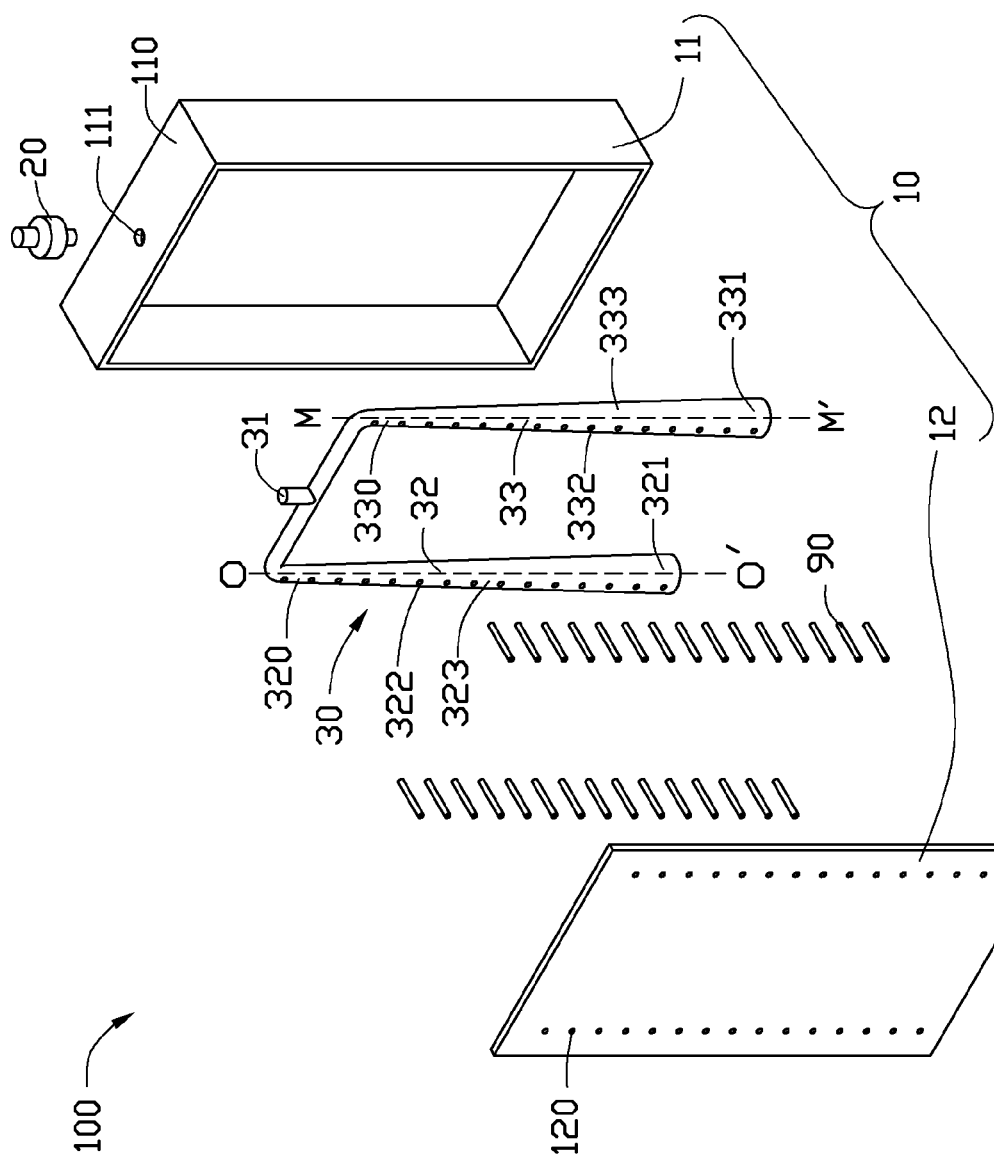
FIG. 1 is an exploded, schematic view of a gas-inputting device for a vacuum sputtering apparatus according to an exemplary embodiment.
Figure 2:
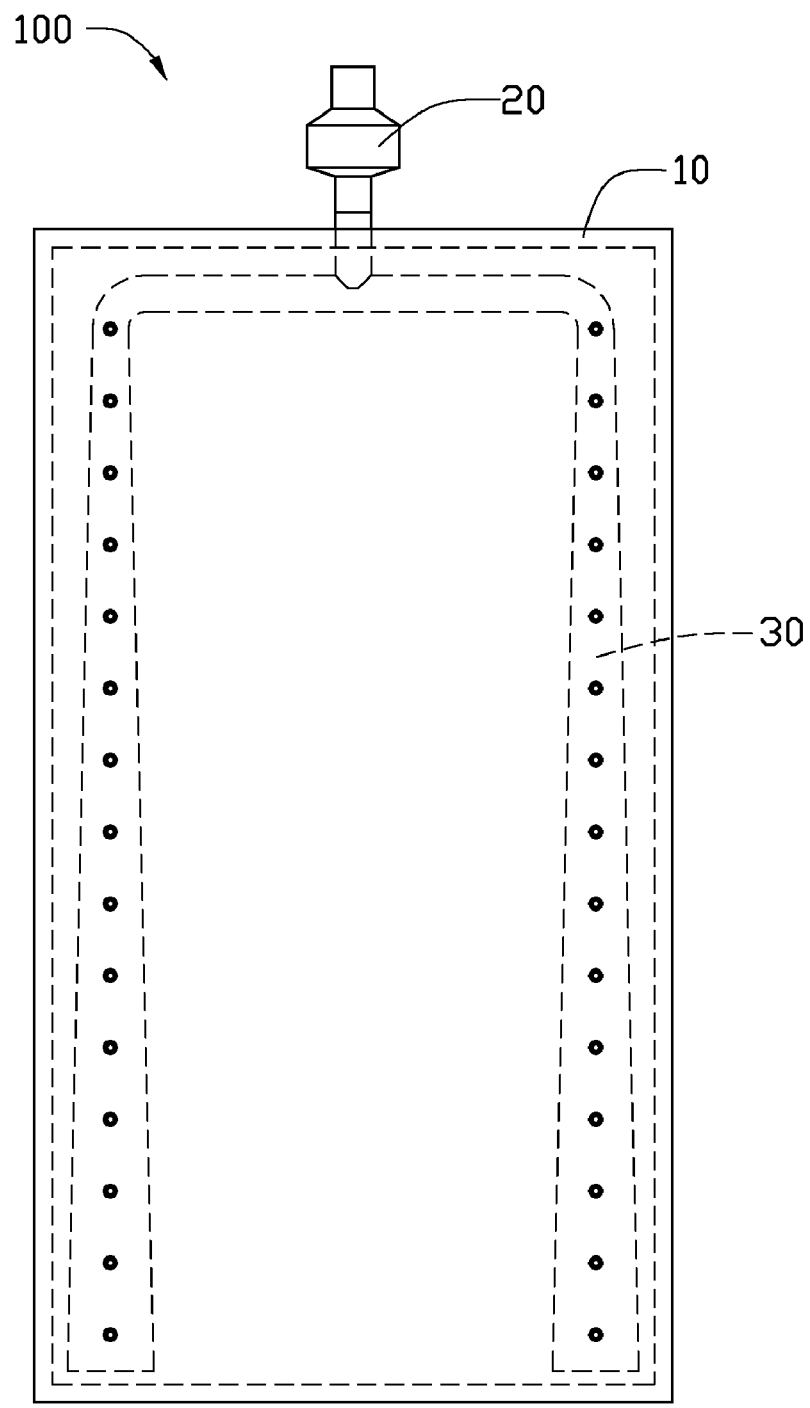
FIG. 2 is a schematic assembled view of the gas-inputting device for a vacuum sputtering apparatus of FIG. 1.

Referring to FIGS. 1 and 2, a gas-inputting device 100 for a vacuum sputtering apparatus according to an exemplary embodiment, is shown. The gas-inputting device 100 is for introducing a gas into a reaction chamber of the vacuum sputtering apparatus. The gas-inputting device 100 includes a receiving box 10, a gas source 20, a gas manifold 30, and a plurality of connecting pipes 90.

The gas manifold 30 includes a tubular inputting portion 31 and two tapered tubes 32 respectively connected to opposite ends of the inputting portion 31. The inputting portion 31 is connected to the gas source 20. Thus, the inert gas can flow into the gas manifold 30 from the gas source 20 via the inputting portion 31. In the present embodiment, the center axes OO', MM' of the two tapered tubes 32 are parallel to each other.

The tapered tube 32 can have a pyramidal configuration or a conical configuration. In the present embodiment, the tapered tube 32 has a conical-shaped configuration. The length of the tapered tube 32 is 600 millimeter. Each tapered tube 32 includes a small end 320 connected to the inputting portion 31, a large end 321 opposite to the small end 320, and a conical surface 323 connecting the small end 320 to the large end 321. A number of gas holes 322 are formed in the conical surface 323.

The small end 320 is connected to and in communication with the inputting portion 31. The large end 321 is sealed. In the present embodiment, the diameter of the small end 320 is 3.2 millimeter, and the diameter of the large end 321 is 5.6 millimeter.

The gas holes 322 are equidistantly arranged along the center axes OO', MM' of the tapered tube 32 from the small end 320 to the large end 321. Each gas hole 322 has a circular configuration and are of the same diameter. In the present embodiment, the conical surface 323 defines fifteen gas holes 322. The gas holes 322 are arranged along a generatrix of the tapered tube 32. The diameter of the gas holes 322 is 0.8 millimeter, and the distance between each two adjacent gas holes 322 is 40 millimeter. The distance from the small end 320 to the gas hole 322 nearest to the small end 320 is 20 millimeter. The distance from the large end 321 to the gas hole 322 nearest to the large end 321 is 20 millimeter. The distance between the center axes OO', MM' of the two tapered tubes 32 is 200 millimeter. In other embodiments, the gas holes 322 can also be rectangular holes, or trapezoidal holes. The gas holes 322 can also be arranged along a helix on the conical surface 323 of the tapered tube 32, and the distances between each two adjacent gas holes 322 along the center axis OO' or, MM' of the tapered tube 32 are same.

During the inputting of inert gas into the vacuum sputtering apparatus using the gas-inputting device 100, the inert gas flows along the two tapered tubes 32 from the small end 320 to the large end 321. The flowing velocity of the inert gas at the small end 320 is higher, because the diameter of the small end 320 is smaller. The inert gas at the small end 320 has a higher gas pressure, but the inert gas has a shorter time to dispense from the gas holes 322, because the small end 320 has a higher velocity. Therefore, the small end 320 will not dispense out an overabundance of inert gas. During the inert gas flowing along the two tapered tubes 32, the gas pressure of the inert gas gradually reduces; thereby the velocity of the inert gas at the large end 321 also decreases from that at the small end 320. The inert gas at the large end 321 has a lower gas pressure, but the inert gas has a longer time to dispense from the gas holes 322, because the large end 321 has a lower velocity. Therefore, the large end 321 dispense out the same amount of the inert gas as the small end 320. As such, the gas density of the inert gas at the small end 320 is generally equal to that of the large end 321. The uniform gas density of the inert gas thus improves the coating quality of the workpiece.

In the present embodiment, the receiving box 10 has a cuboid-shaped configuration. The receiving box 10 includes a main body 11 and a cover 12. The gas manifold 30 is received in the receiving box 10. A first through hole 111 is defined in a top wall 110 of the main body 11. The inputting portion 31 of the gas manifold 30 extends out of the receiving box 10 through the first through hole 111, to connect to the gas source 20.

The cover 12 of the receiving box 10 defines a number of second through holes 120 corresponding to the gas holes 322 of the tapered tubes 32. The second through holes 120 are arranged along the length of the receiving box 10. Each connecting pipe 90 connects one gas hole 322 to a corresponding second through hole 120.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A gas-inputting device for a vacuum sputtering apparatus comprising a gas source and at least one tapered tube, each of the at least one tapered tube comprising:
    an open end connected to the gas source and configured for introducing gas into the tapered tube;
    a closed end opposing to the open end, each of the at least one tapered tube tapering from the closed end to the open end;
    a conical surface connecting the open end to the closed end, a plurality of gas holes of a same size defined in the conical surface and equidistantly arranged along the center axis of the tapered tube from the open end to the closed end.

2. The gas-inputting device for a vacuum sputtering apparatus as claimed in claim 1, wherein the at least one tapered tube comprises two tapered tubes, and the two open ends of two tapered tube are connected to each other.

3. The gas-inputting device for a vacuum sputtering apparatus as claimed in claim 1, wherein the tapered tube has a pyramidal configuration.

4. The gas-inputting device for a vacuum sputtering apparatus as claimed in claim 1, wherein the tapered tube has a conical configuration.

5. The gas-inputting device for a vacuum sputtering apparatus as claimed in claim 1, wherein the gas holes are aligned with a generatrix of the tapered tube.

6. The gas-inputting device for a vacuum sputtering apparatus as claimed in claim 1, wherein the gas holes are arranged along an imaginary helix on the conical surface.

7. The gas-inputting device for a vacuum sputtering apparatus as claimed in claim 1, wherein the gas holes are circular holes.

8. The gas-inputting device for a vacuum sputtering apparatus as claimed in claim 1, wherein the distance from the open end to the gas hole nearest to the small end is equal to that from the large end to the gas hole nearest to the large end.

9. The gas-inputting device for a vacuum sputtering apparatus as claimed in claim 1, further comprising a receiving box, the at least one tapered tube is received in the receiving box, a plurality of through holes are defined in the receiving box spatially corresponding to the gas holes of the tapered tube, and each through hole is connected to a corresponding gas hole.

10. The gas-inputting device for a vacuum sputtering apparatus as claimed in claim 9, further comprising a plurality connecting pipes connecting the gas holes to the respective through holes.

11. The gas-inputting device for a vacuum sputtering apparatus as claimed in claim 10, wherein the receiving box comprises a main body and a cover, the at least one tapered tube is received in the main body, the through holes are arrayed on the cover spatially corresponding to the gas holes of the tapered tube.

12. The gas-inputting device for a vacuum sputtering apparatus as claimed in claim 10, wherein the receiving box has a cuboid-shaped configuration.

* * * * *